United States Patent
Tsuruta

(10) Patent No.: US 9,240,247 B2
(45) Date of Patent: Jan. 19, 2016

(54) RING OSCILLATOR AND SEMICONDUCTOR DEVICE

(71) Applicant: SOCIONEXT INC., Yokohama, Kanagawa (JP)

(72) Inventor: Tomoya Tsuruta, Koganei (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 13/929,546

(22) Filed: Jun. 27, 2013

(65) Prior Publication Data

US 2014/0002199 A1     Jan. 2, 2014

(30) Foreign Application Priority Data

Jul. 2, 2012  (JP) ................ 2012-148493

(51) Int. Cl.
```
H03K 3/03     (2006.01)
G11C 29/00    (2006.01)
H03K 3/02     (2006.01)
G11C 29/02    (2006.01)
G11C 29/50    (2006.01)
G11C 11/41    (2006.01)
```

(52) U.S. Cl.
CPC .............. *G11C 29/00* (2013.01); *G11C 29/021* (2013.01); *G11C 29/023* (2013.01); *G11C 29/028* (2013.01); *G11C 29/50012* (2013.01); *H03K 3/02* (2013.01); *H03K 3/0315* (2013.01); *G11C 11/41* (2013.01)

(58) Field of Classification Search
CPC .... H03K 3/0315; G11C 11/41; G11C 11/412; G11C 11/419; G11C 29/12015; G11C 7/22; G11C 7/222; G11C 29/50012; G11C 2029/0403
USPC ........... 331/57, 44; 365/154, 156, 210.1, 201, 365/189.03, 189.19
See application file for complete search history.

(56) References Cited

U.S. PATENT DOCUMENTS

| | | | |
|---|---|---|---|
| 6,734,744 B2 * | 5/2004 | Monzel et al. .................. | 331/57 |
| 7,082,067 B2 * | 7/2006 | Venkatraman et al. ....... | 365/201 |
| 2010/0073982 A1 | 3/2010 | Asayama et al. | |

FOREIGN PATENT DOCUMENTS

| | | |
|---|---|---|
| JP | 60-72319 A | 4/1985 |
| JP | 10-242806 A | 9/1998 |
| JP | 2010-073282 A | 4/2010 |

* cited by examiner

*Primary Examiner* — Ryan Johnson
(74) *Attorney, Agent, or Firm* — Arent Fox LLP

(57) ABSTRACT

A ring oscillator includes a plurality of ring-connected delay circuits. At least one of the plurality of delay circuits has an SRAM cell and a path circuit connected in parallel to the SRAM cell. The SRAM cell outputs an output signal from a second node to the delay circuit in the next stage within the plurality of delay circuits in response to one of rise transition and fall transition of a signal to be input to a first node from the delay circuit in the previous stage within the plurality of delay circuits. The path circuit outputs an output signal to the delay circuit in the next stage in response to the other transition of the one of transitions.

7 Claims, 11 Drawing Sheets

US 9,240,247 B2

RING OSCILLATOR AND SEMICONDUCTOR DEVICE

CROSS-REFERENCE TO RELATED APPLICATION

This application is based upon and claims the benefit of priority of the prior Japanese Patent Application No. 2012-148493, filed on Jul. 2, 2012, the entire contents of which are incorporated herein by reference.

FIELD

The embodiments discussed herein relate to a ring oscillator and a semiconductor device.

BACKGROUND

It is known to adjust the electrical characteristics of an SRAM cell by changing etc. the body potential of the well of a transistor, which is a component of the SRAM cell, or the potential of the word line in order to suppress the influence of the manufacture variations of the semiconductor device on which the SRAM cell is mounted on the electrical characteristics. It is possible to measure the electrical characteristics of the transistor, such as the on-current and the threshold voltage, used when adjusting the electrical characteristics of the SRAM cell as analog signals using an electric probe etc. However, in such measurement, analog signals are measured, and therefore the measurement is vulnerable to various kinds of measurement noises, and thus it is not easy to perform measurement with high precision.

On the other hand, it is known to use a ring oscillator in order to evaluate the speed characteristic of various kinds of elements to be mounted on the semiconductor device. A ring oscillator is formed by ring-connecting a single or a plurality of non-inversion elements and an odd number of inversion elements.

Further, there is known a semiconductor device having a logic part forming a logic circuit and a memory part formed by a plurality of SRAM cells arranged in the form of an array. In such a semiconductor device, various kinds of logic elements of the transistors arranged in the logic part are arranged based on the same layout wiring rules. On the other hand, the SRAM cells arranged in the memory part are arranged, in many cases, based on layout wiring rules different from those of the transistors used in the logic part forming the logic circuit. Since in general, a six-transistor configuration is adopted for the SRAM cell, layout wiring rules in which the layout intervals are narrowed as much as possible are adopted in order to prevent the layout wiring area from increasing.

It is known to use a ring oscillator formed by ring-connecting a plurality of SRAM cells in order to evaluate the speed of the SRAM cells to be arranged based layout wiring rules different from those of the logic part. For example, a ring oscillator formed by ring-connecting a plurality of SRAM cells in which the gate terminals and the drain terminals of a pair of transmission transistors are connected to each other is used. Delay circuits configured to output an inverted signal are ring-connected, by connecting the output terminal of an inverter element inside the SRAM cell and the drain terminal of the transmission transistor of the SRAM cell.

RELATED DOCUMENTS

[Patent Document 1] Japanese Laid Open Patent Document No. 2010-73282

[Patent Document 2] Japanese Laid Open Patent Document No. 04-30764

[Patent Document 3] Japanese Laid Open Patent Document No. 10-242806

SUMMARY

According to an aspect of the embodiments, a ring oscillator includes a plurality of ring-connected delay circuits. At least one of the plurality of delay circuits has an SRAM cell and a path circuit connected in parallel to the SRAM cell. The SRAM cell outputs an output signal from a second node to the delay circuit in the next stage within the plurality of delay circuits in response to one of rise transition and fall transition of a signal to be input to a first node from the delay circuit in the previous stage within the plurality of delay circuits. The path circuit outputs an output signal to the delay circuit in the next stage in response to the other transition of the one of transitions.

The object and advantages of the embodiments will be realized and attained by means of the elements and combination particularly pointed out in the claims.

It is to be understood that both the foregoing general description and the following detailed description are exemplary and explanatory and are not restrictive of the invention.

DESCRIPTION OF EMBODIMENTS

First, a first embodiment of a ring oscillator is explained with reference to FIGS. 1 and 2.

Figure 1:
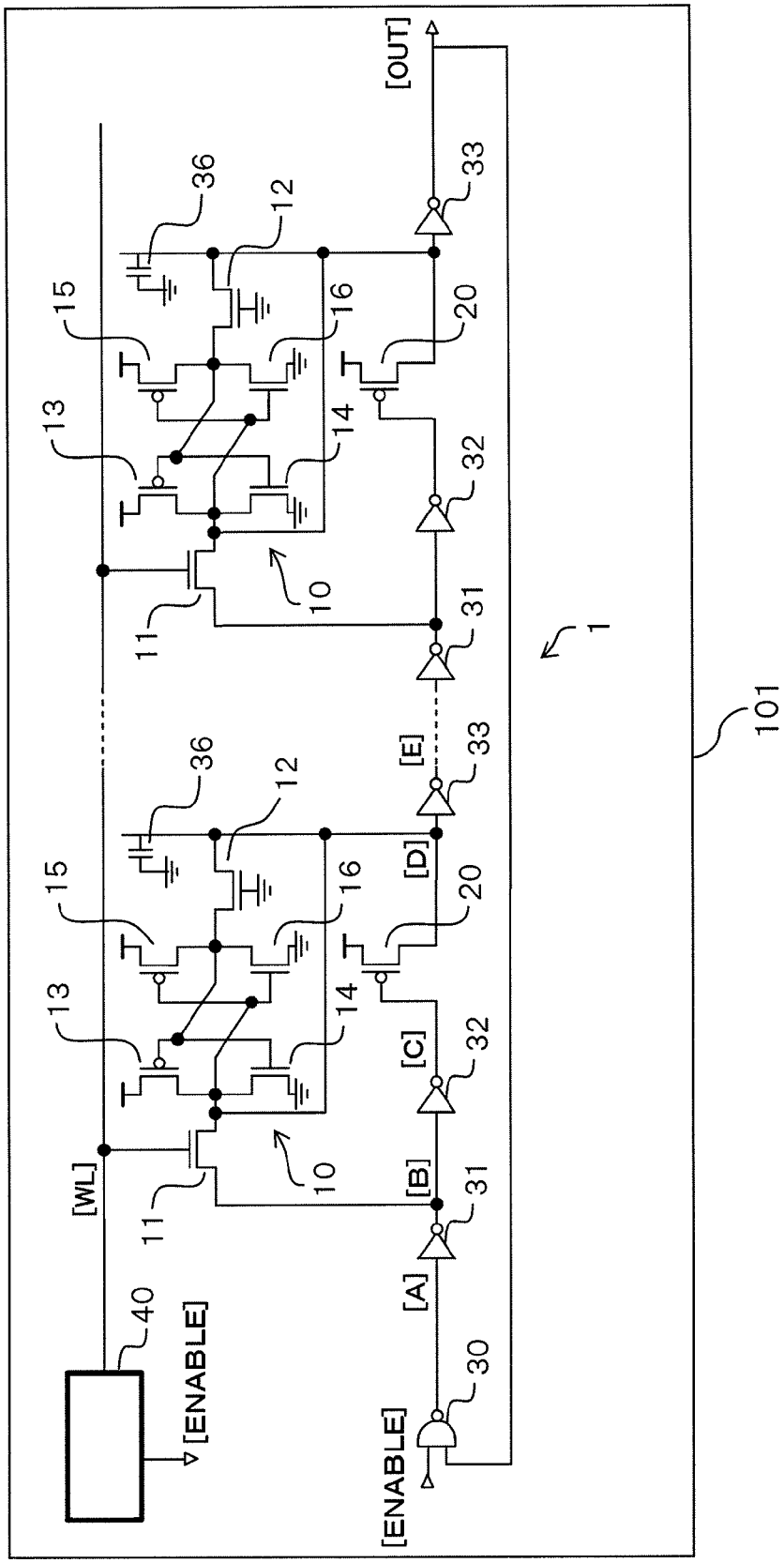
FIG. 1 is a diagram illustrating an example of a ring oscillator.

FIG. 1 is a diagram illustrating an example of a ring oscillator.

A ring oscillator 1 is formed on a semiconductor device 101, and has parts of a plurality of SRAM cells 10, a plurality of pull-up elements 20, a NAND element 30, and a plurality of inverter elements 31 to 33, and further has a control unit 40.

The SRAM cell 10 is an SRAM cell having a six-transistor configuration. The SRAM cell 10 has a first and a second transmission transistor 11 and 12, a first pull-up transistor 13 and a first pull-down transistor 14, and a second pull-up transistor 15 and a second pull-down transistor 16.

Each of the first and the second transmission transistor 11 and 12 has an nMOS transistor.

The gate terminal of the first transmission transistor 11 is connected to the word line. The source terminal of the first transmission transistor 11 is connected to the drain terminals of the first pull-up transistor 13 and the first pull-down transistor 14, and to the gate terminals of the second pull-up transistor 15 and the second pull-down transistor 16. Further, the source terminal of the first transmission transistor 11 is connected to the drain terminal of the second transmission transistor 12, the drain terminal of the pull-up element 20, and the input terminal of the inverter element 33. Furthermore, the source terminal of the first transmission transistor 11 is connected to a capacitor 36. The capacitor 36 is a parasitic capacitor of the bit line connected in parallel with an SRAM cell other than the SRAM cell 10. The drain terminal of the first transmission transistor 11 is connected to the output terminal of the inverter element 31 and to the input terminal of the inverter element 32.

The gate terminal of the second transmission transistor 12 is connected to VSS. Thus, the second transmission transistor 12 is always in the off state, i.e, it is not active at any time. The source terminal of the second transmission transistor 12 is connected to the gate terminals of the first pull-up transistor 13 and the first pull-down transistor 14, and to the drain terminals of the second pull-up transistor 15 and the second pull-down transistor 16.

In the first and the second transmission transistors 11 and 12, a current flows in both directions, and therefore it is not possible to uniquely determine the source terminal and the drain terminal. Thus, in the present specification, the terminals of the first and the second transmission transistors 11 and 12 connected to the components of the SRAM cell 10 are referred to as the source terminals. In other words, the terminals connected to the first and the second pull-up transistors 13 and 15, and to the first and the second pull-down transistors 14 and 16 are referred to as the source terminals. On the other hand, in the present specification, the terminals of the first and the second transmission transistors 11 and 12 connected to the external elements of the SRAM 10 are referred to as the drain terminals.

Each of the first and the second pull-up transistors 13 and 15 has a pMOS transistor. Each source terminal of the first and the second pull-up transistors 13 and 15 is connected to VDD.

Each of the first and the second pull-down transistors 14 and 16 has an nMOS transistor. Each source terminal of the first and the second pull-down transistor 14 and 16 is connected to VSS.

The above-described six transistors forming the SRAM cell are arranged and wired on the semiconductor device 101 based on layout wiring rules whose intervals are narrower than layout wiring rules in which the logical circuit elements, such as the plurality of pull-up elements 20, the plurality of NAND elements 30, and the plurality of inverter elements 31 to 33, are arranged.

The pull-up element 20 has a pMOS transistor. The pMOS transistor forming the pull-up element 20 is arranged so that the operation speed is ten times the operation speed of the first transmission transistor 11.

The gate terminal of the pull-up element 20 is connected to the output terminal of the inverter element 32, and the source terminal of the pull-up element 20 is connected to VDD. The drain terminal of the pull-up element 20 is connected to the source terminal of the first transmission transistor 11 and to the input terminal of the inverter element 33. Further, the drain terminal of the pull-up element 20 is connected to the drain terminals of the first pull-up transistor 13 and the first pull-down transistor 14, and to the gate terminals of the second pull-up transistor 15 and the second pull-down transistor 16.

The pull-up element 20 has a function to raise the signal level of a signal at the source terminal of the first transmission transistor 11 connected in parallel from the L level to the H level. When the signal levels at the drain terminal of the first transmission transistor 11 and at the output terminal of the inverter element 31 transit to rise, the pull-up element 20 supplies a signal at the H level to the source terminal of the first transmission transistor 11. On the other hand, when the signal level at the output terminal of the inverter element 31 transits to fall, the pull-up element 20 enters the off state and the drain terminal of the pull-up element 20 enters a high-impedance state.

The first input terminal of the NAND element 30 is connected to the control unit 40 and the second input terminal of the NAND element 30 is connected to the output terminal of the inverter element 33 in the final stage. The output terminal of the NAND element 30 is connected to the input terminal of the inverter element 31 in the initial stage.

When an H-level signal is input to the first input terminal of the NAND element 30, the ring oscillator 1 enters the oscillation state and when an L-level signal is input to the first input terminal of the NAND element 30, the ring oscillator 1 enters the oscillation stopped state.

While the H-level signal is being input to the first input terminal of the NAND element 30, if the L-level signal is input to the second input terminal, the output terminal of the NAND element 30 outputs the H-level signal. On the other hand, while the H-level signal is being input to the first input terminal of the NAND element 30, if the H-level signal is input to the second input terminal, the output terminal of the NAND element 30 outputs the L-level signal. In the ring oscillator 1, the output terminal of the NAND element 30 and the second input terminal are ring-connected, and therefore when the H-level signal is input to the first input terminal, the ring oscillator 1 oscillates in a period in accordance with the delay speed of the connected element.

The inverter elements 31 to 33 are connected in series via the pull-up element 20 connected between the inverter elements 32 and 33. The inverter elements 31 and 33 are connected in series to the first transmission transistor 11, respectively, for each of the plurality of SRAM cells 10. The pull-up element 20 and the inverter element 32 are connected in parallel to the first transmission transistor 11, respectively, for each of the plurality of SRAM cells 10, and function as a compensation path circuit configured to output a rise signal to the inverter element 33. In other words, if the inverter element 31 outputs a fall signal, the signal propagates to the inverter element 33 via the first transmission transistor 11. On the other hand, if the inverter element 31 outputs a fall signal, the signal propagates to the inverter element 33 via the inverter element 32 and the pull-up element 20.

The input terminal of the inverter element 31 in the initial stage is connected to the output terminal of the NAND element 30. The output terminal of the inverter element 33 in the initial stage is connected to the input terminal of the inverter element 31 in the second stage. The output terminal of the inverter element 33 in the previous stage is connected to the input terminal of the inverter element 31 in the next stage. Then, the output terminal of the inverter element 33 in the final stage is connected to one of the input terminals of the NAND element 30.

The control unit 40 has a plurality of logic elements and oscillates the ring oscillator 1 based on a command signal input from the outside of the semiconductor device 101. Upon receipt of a command signal, the control unit 40 supplies the H-level signal to the word line and then supplies the H-level signal to the first input terminal of the NAND element.

Next, the operation of the components of the ring oscillator 1 in the oscillation state is explained.

Figure 2:
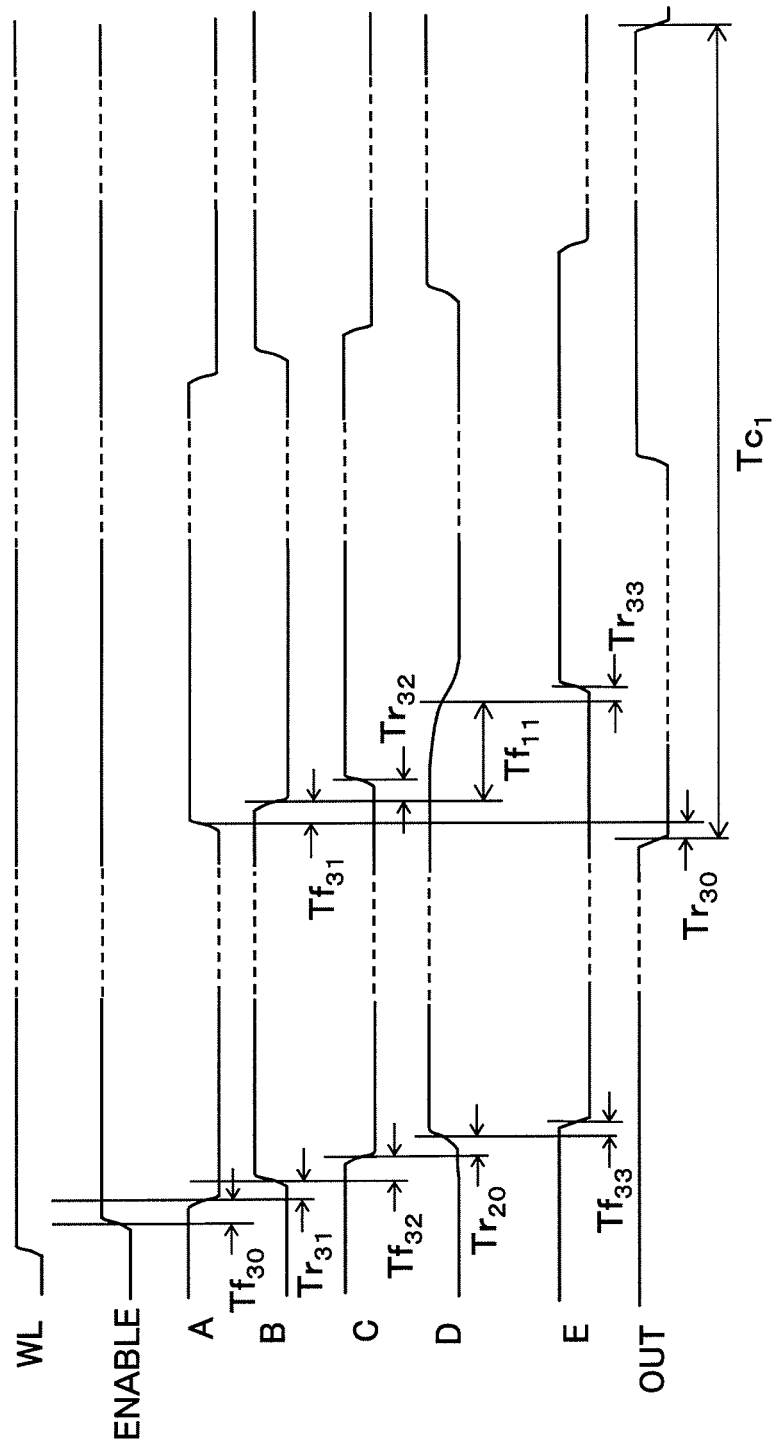
FIG. 2 is a timing chart of the ring oscillator described in FIG. 1.

FIG. 2 is a timing chart of the ring oscillator 1.

A waveform [ENABLE] is a waveform of an enable signal to be input to the first input terminal of the NAND element 30. When the waveform [ENABLE] is at the H level, the ring oscillator 1 enters the oscillation state.

A waveform [WL] is a waveform of a word line signal to be input to the gate terminal of the first transmission transistor 11. When the waveform [WL] is at the H level, the first transmission transistor 11 is active.

A waveform [A] is a waveform of an output signal of the NAND element 30.

A waveform [B] is a waveform of an output signal of the inverter element 31. A signal having the waveform indicated by the waveform [B] is input to the drain terminal of the first transmission transistor 11.

A waveform [C] is a waveform of an output signal of the inverter element 32. A signal having the waveform indicated by the waveform [C] is input to the gate terminal of the pull-up element 20.

A waveform [D] is a waveform of a signal at the source terminal of the first transmission transistor 11 and at the drain terminal of the pull-up element 20.

A waveform [E] is a waveform of an output signal of the inverter element 33. A signal having the waveform indicated by the waveform [E] is input to the input terminal of the inverter element 31 in the next stage.

A waveform [OUT] is a waveform of an output signal of the inverter element 33 in the final stage. A signal having the waveform indicated by the waveform [OUT] is input to the second input terminal of the NAND element 30.

As indicated by the waveform [WL], upon receipt of a command signal, the control unit 40 supplies the H-level signal to the word line. By supplying the H-level signal to the word line, the first transmission transistor 11 is active.

Next, as indicated by the waveform [ENABLE], the ring oscillator 1 enters the oscillation state by supplying the H-level signal to the first input terminal of the NAND element 30 from the control unit 40.

Next, as indicated by the waveform [A], when a time $Tf_{30}$ elapses after the H-level signal is input to the first input terminal, the NAND element 30 outputs the L-level signal to the input terminal of the inverter element 31. The time $Tf_{30}$ is the fall delay time of the NAND element 30.

Next, as indicated by the waveform [B], when a time $Tr_{31}$ elapses after the L-level signal is input to the input terminal, the inverter element 31 outputs the H-level signal to the drain terminal of the first transmission transistor 11 and to the input terminal of the inverter element 32. The time $Tr_{31}$ is the rise delay time of the inverter element 31.

Next, as indicated by the waveform [C], when a time $Tf_{32}$ elapses after the H-level signal is input to the input terminal, the inverter element 32 outputs the L-level signal to the gate terminal of the pull-up element 20. The time $Tf_{32}$ is the fall delay time of the inverter element 32.

Next, as indicated by the waveform [D], when a time $Tr_{20}$ elapses after the L-level signal is input to the gate terminal, the pull-up element 20 outputs the H-level signal to the source terminal of the first transmission transistor 11 and to the input terminal of the inverter element 33. The time $Tr_{20}$ is the rise delay time of the pull-up element 20.

Since the first transmission transistor 11 is active, the source terminal of the first transmission transistor 11 starts displacement after the H-level signal is output to the drain terminal from the inverter element 31. However, the pull-up element 20 is arranged so as to operate at a speed higher than that of the first transmission transistor 11. Thus, the rise delay time of the signal at the source terminal of the first transmission transistor 11 is determined by the transition of the signal at the drain terminal of the pull-up element 20.

Next, as indicated by the waveform [E], when a time $Tf_{33}$ elapses after the H-level signal is input to the input terminal, the inverter element 33 outputs the L-level signal to the input terminal of the inverter element 31 in the second stage. The time $Tf_{33}$ is the fall delay time of the inverter element 33.

Then, the transition of the signal propagates sequentially up to the inverter element 33 in the final stage. Then, as indicated by the waveform [OUT], the inverter element 33 in the final stage outputs the L-level signal to the second input terminal of the NAND element 30.

Next, as indicated by the waveform [A], when a time $Tr_{30}$ elapses after the H-level signal is input to the second input terminal, the NAND element 30 outputs the H-level signal to the input terminal of the inverter element 31. The time $Tr_{30}$ is the rise delay time of the NAND element 30.

Next, as indicated by the waveform [B], when a time $Tf_{31}$ elapses after the H-level signal is input to the input terminal, the inverter element 31 outputs the L-level signal to the drain terminal of the first transmission transistor 11 and to the input terminal of the inverter element 32. The time $Tf_{31}$ is the fall delay time of the inverter element 31.

Next, as indicated by the waveform [C], when a time $Tr_{32}$ elapses after the L-level signal is input to the input terminal, the inverter element 32 outputs the H-level signal to the gate terminal of the pull-up element 20. The time $Tr_{32}$ is the rise delay time of the inverter element 32.

When the H-level signal is input to the gate terminal of the pull-up element 20, the pull-up element 20 enters the off state, and therefore the signal at the drain terminal of the pull-up element 20 is kept at the H level.

Next, as indicated by the waveform [D], when a time $Tf_{11}$ elapses after the L-level signal is input to the drain terminal of the first transmission transistor 11, the signal at the source terminal of the first transmission transistor 11 transits to fall. The time $Tf_{11}$ is the delay time when the signal at the source terminal of the first transmission transistor 11 transits to fall.

Next, as indicated by the waveform [E], when a time $Tr_{33}$ elapses after the L-level signal is input to the input terminal, the inverter element 33 outputs the H-level signal to the input terminal of the inverter element 31 in the second stage. The time $Tr_{33}$ is the rise delay time of the inverter element 33.

Then, the propagation reaches the inverter element 33 in the final stage and as indicated by the waveform [OUT], the inverter element 33 in the final stage outputs the H-level signal to the second input terminal of the NAND element 30. A time $Tc_1$ is the oscillation period of the ring oscillator 1.

As above, the operation of the components of the ring oscillator 1 in the oscillation state is explained.

An example of the method for calculating the delay time $Tf_{11}$ when the signal at the source terminal of the first transmission transistor 11 transits to fall from the oscillation period $Tc_1$ of the ring oscillator 1 is explained.

First, the oscillation period $Tc_1$ of the ring oscillator 1 is determined. The oscillation period $Tc_1$ of the ring oscillator 1 is determined from the oscillation waveform displayed on the display screen of an oscilloscope.

Next, a total delay time Ti of the NAND element 30 and the plurality of inverter elements 31 to 33 is determined. The total delay time Ti of the NAND element 30 and the plurality of inverter elements 31 to 33 is determined from an oscillation period of a ring oscillator, not illustrated schematically, having the inverter elements 31 to 33 in the same number as that of the inverter elements 31 to 33 that the ring oscillator 1 has.

Next, a total delay time Tpu of the plurality of pull-up elements 20 is determined. The total delay time Tpu of the plurality of pull-up elements 20 is determined from oscillation periods of at least two ring oscillators, not illustrated schematically, having pull-up elements with different transistor sizes. For example, the delay time Tpu is determined by comparing the oscillation period of the ring oscillator having the same transistor size as that of the pull-up element 20, and the oscillation period of the ring oscillator having a pull-up element having a transistor size twice that of the pull-up element 20.

Then, from the oscillation period $Tc_1$ of the ring oscillator 1, the total delay time Ti of the plurality of inverter elements 31 to 33, and the total delay time Tpu of the plurality of pull-up elements 20 that are determined, the delay time $Tf_{11}$ is calculated using a formula (1).

$$Tf_{11} = (Tc_1 - (Ti + Tpu))/N \tag{1}$$

Here, N is the number of the first transmission transistors 11 included in the ring oscillator 1.

Using the ring oscillator 1, the delay time $Tf_{11}$ reflecting the ratio of the current drive performance between the first transmission transistor 11 and the first pull-up transistor 13 is calculated.

In the ring oscillator 1, a bypass output is produced not through a path passing through all the components forming the SRAM 10 but through a path between the drain terminal and the source terminal of the first transmission transistor 11, which is one of the components forming the SRAM cell 10. Thus, it is possible to measure the delay time of the first transmission transistor 11 to be measured, which is one of the components of the SRAM 10.

Further, the pull-up element 20 and the inverter element 32 connected in parallel to the first transmission transistor 11 have a function as a compensation path circuit of the first transmission transistor 11. In other words, when a signal that transits to rise is applied to the drain terminal of the first transmission transistor 11, the pull-up element 20 turns on before a rise delay time $Tr_{11}$ of the first transmission transistor 11 elapses. Thus, the oscillation period $Tc_1$ of the ring oscillator 1 includes the rise delay time $Tr_{20}$ of the pull-up element 20 in place of the rise delay time $Tr_{11}$ of the first transmission transistor 11 as a result. Thus, in the ring oscillator 1, it is possible to calculate the fall delay time $Tf_{11}$ of the first transmission transistor 11 separately from the rise delay time $Tr_{11}$ of the first transmission transistor 11.

As above, the first embodiment of the ring oscillator is explained.

Figure 3:
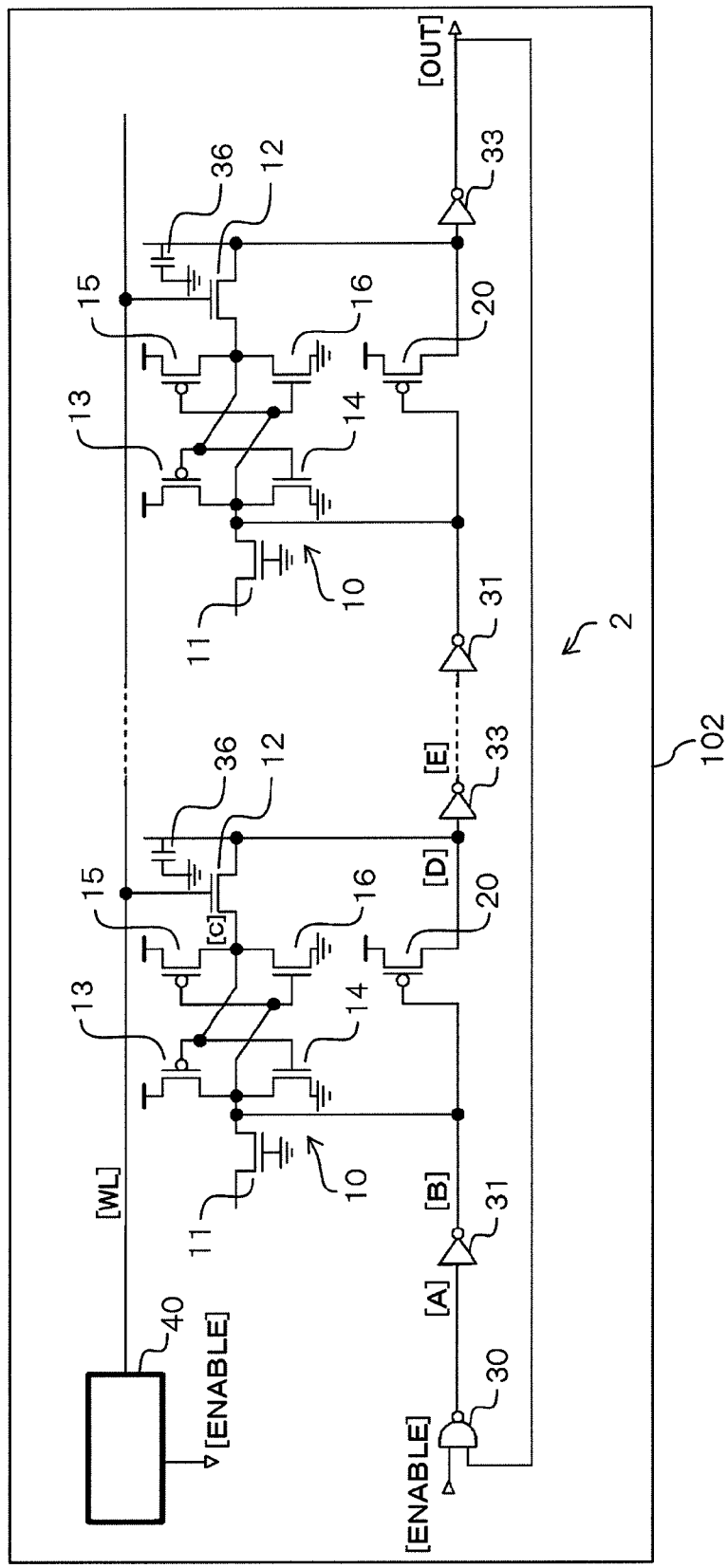
FIG. 3 is a diagram illustrating another example of a ring oscillator.
Figure 4:
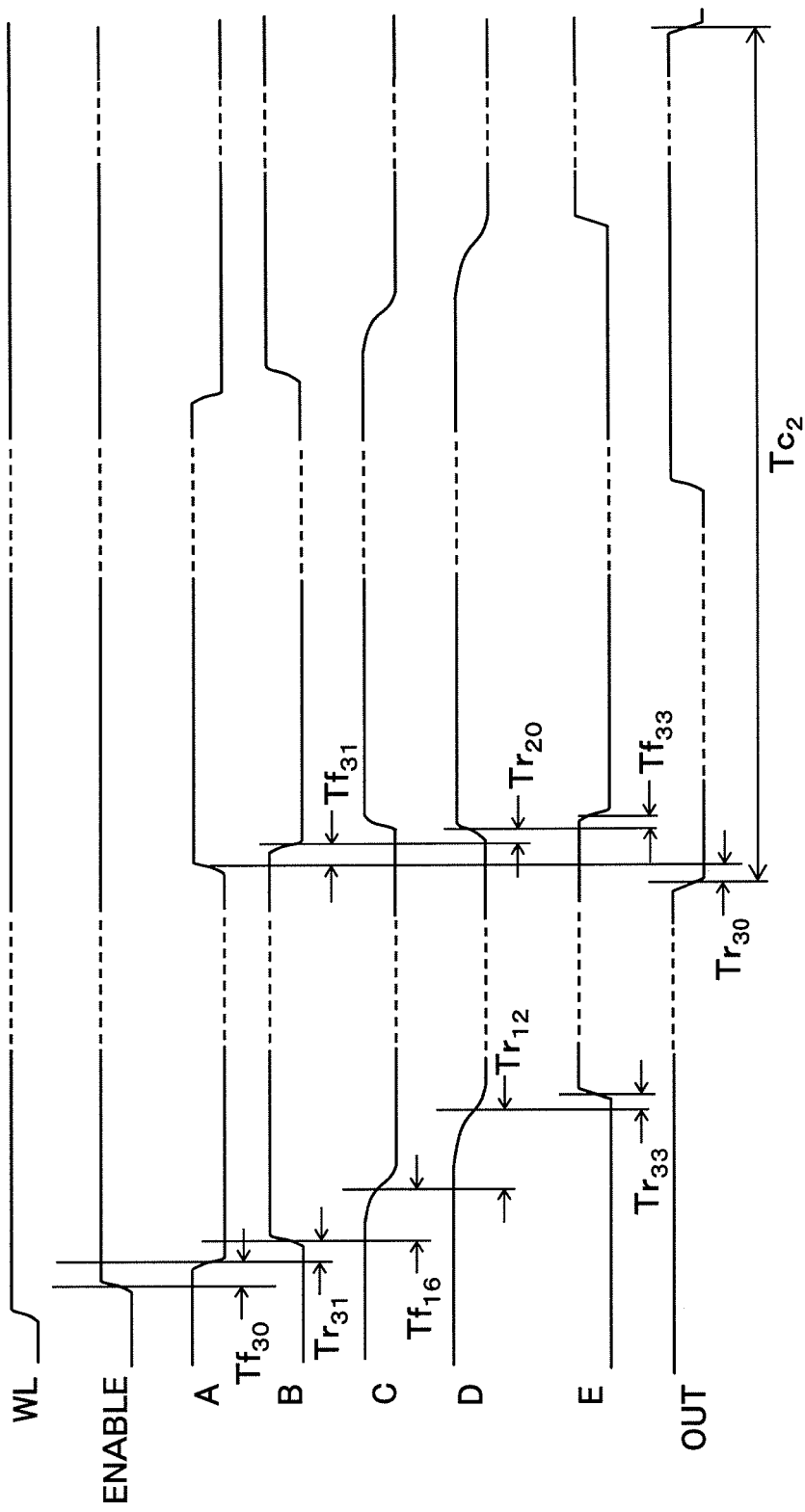
FIG. 4 is a timing chart of the ring oscillator described in FIG. 3.

Next, with reference to FIG. 3 and FIG. 4, a second embodiment of a ring oscillator is explained.

FIG. 3 is a diagram illustrating an example of the ring oscillator.

A ring oscillator 2 has an even number of the SRAM cells 10 formed on a semiconductor device 102 and part of components of which are connected to the ring oscillator 2, an even number of the pull-up elements 20, the NAND element 30, and an even number of the inverter elements 31 and 33. Further, the ring oscillator 2 has the control unit 40.

The gate terminal of the first transmission transistor 11 is connected to VSS and the first transmission transistor 11 is always in the off state. The source terminal of the first transmission transistor 11 is connected to the output terminal of the inverter element 31. The drain terminal of the first transmission transistor 11 is brought into the open state.

The gate terminal of the second transmission transistor 12 is connected to the word line. The drain terminal of the second transmission transistor 12 is connected to the input terminal of the inverter element 33.

The output terminal of the inverter element 31 is connected to the source terminal of the first transmission transistor 11 and to the gate terminal of the pull-up element 20. Further, the output terminal of the inverter element 31 is connected to the drain terminals of the first pull-up transistor 13 and the first pull-down transistor 14, and to the gate terminals of the second pull-up transistor 15 and the second pull-down transistor 16.

The drain terminal of the pull-up element 20 is connected to the drain terminal of the second transmission transistor 12 and to the input terminal of the inverter element 33.

Thus, the first pull-up transistor 13 and the first pull-down transistor 14, the second pull-up transistor 15 and the second pull-down transistor 16, and the second transmission transistor 12 are connected in parallel to the pull-up element 20.

The pull-up element 20 has a function to raise the signal level of a signal at the source terminal of the second transmission transistor 12 connected in parallel from the L level to the H level.

Next, the operation of the components of the ring oscillator 2 in the oscillation state is explained.

FIG. 4 is timing chart of the ring oscillator 2.

As indicated by the waveform [WL], upon receipt of a command signal, the control unit 40 supplies the H-level signal to the word line. By supplying the H-level signal to the word line, the second transmission transistor 12 is active.

Next, as indicated by the waveform [ENABLE], the ring oscillator 2 enters the oscillation state by supplying the H-level signal to the first input terminal of the NAND element 30 from the control unit 40.

Next, as indicated by the waveform [A], when the time $Tf_{30}$ elapses after the H-level signal is input to the first input terminal, the NAND element 30 outputs the L-level signal to the input terminal of the inverter element 31. The time $Tf_{30}$ is the fall delay time of the NAND element 30.

Next, as indicated by the waveform [B], when the time $Tr_{31}$ elapses after the L-level signal is input to the input terminal, the inverter element 31 outputs the H-level signal to the gate terminal of the second pull-down transistor 16, to the gate terminal of the pull-up element 20, etc. The time $Tr_{31}$ is the rise delay time of the inverter element 31.

Next, as indicated by the waveform [C], when a time $Tf_{16}$ elapses after the H-level signal is input to the input terminal, the signal at the drain terminal of the second pull-down transistor 16 turns to a signal at the L level. The time $Tf_{16}$ is the delay time when the signal at the drain terminal of the second pull-down transistor 16 transits to fall. The signal at the drain terminal of the second pull-down transistor 16 is equivalent to the signal at the source terminal of the second transmission transistor 12.

Next, as indicated by the waveform [D], when a time $Tf_{12}$ elapses after the signal at the source terminal of the second transmission transistor 12 turns to the L level, the signal at the drain terminal of the second transmission transistor 12 turns to a signal at the L level. The time $Tf_{12}$ is the fall delay time of the second transmission transistor 12. The signal at the drain terminal of the second transmission transistor 12 is equivalent to the signal at the input terminal of the inverter element 33.

Next, as indicated by the waveform [E], when the time $Tr_{33}$ elapses after the L-level signal is input to the input terminal, the inverter element 33 outputs the H-level signal to the input terminal of the inverter element 31 in the second stage. The time $Tr_{33}$ is the rise delay time of the inverter element 33.

Then, the transition of the signal propagates sequentially up to the inverter element 33 in the final stage. Then, as indicated by the waveform [OUT], the inverter element 33 in the final stage outputs the L-level signal to the second input terminal of the NAND element 30.

Next, as indicated by the waveform [A], when the time $Tr_{30}$ elapses after the H-level signal is input to the second input terminal, the NAND element 30 outputs the H-level signal to the input terminal of the inverter element 31. The time $Tr_{30}$ is the rise delay time of the NAND element 30.

Next, as indicated by the waveform [B], when the time $Tf_{31}$ elapses after the H-level signal is input to the input terminal, the inverter element 31 outputs the L-level signal to the gate terminal of the second pull-down transistor 16, to the gate terminal of the pull-up element 20, etc. The time $Tf_{31}$ is the fall delay time of the inverter element 31.

Next, as indicated by the waveform [D], when the time $Tr_{20}$ elapses after the L-level signal is input to the gate terminal, the pull-up element 20 enters the on state and the source terminal of the pull-up element 20 turns to the H level. The time $Tr_{20}$ is the rise delay time of the pull-up element 20.

When the source terminal of the pull-up element 20 turns to the H level, the drain terminal of the second transmission transistor 12 and the input terminal of the inverter element 33 turn to the H level.

Next, as indicated by the waveform [E], when the time $Tr_{33}$ elapses after the L-level signal is input to the input terminal, the inverter element 33 outputs the H-level signal to the input terminal of the inverter element 31 in the second stage. The time $Tr_{33}$ is the rise delay time of the inverter element 33.

Then, the propagation reaches the inverter element 33 in the final stage and as indicated by the waveform [OUT], the inverter element 33 in the final stage outputs the H-level signal to the second input terminal of the NAND element 30. A time $Tc_2$ is the oscillation period of the ring oscillator 2.

A sum $Tf_{16+12}$ of the delay times $Tf_{16}$ and $Tf_{12}$ is calculated using a formula (2).

$$Tf_{16+12}=(Tc_2-(Ti+Tpu))/N \qquad (2)$$

Here, $Tc_2$ is the oscillation period of the ring oscillator 2, Ti is the total delay time of the NAND element 30 and the plurality of inverter elements 31 and 33, and Tpu is the total delay time of the plurality of pull-up elements 20. N is the number of the second pull-down transistors 16 and the second transmission transistors 12 included in the ring oscillator 2.

By using the ring oscillator 2, the delay time $Tf_{16+12}$ reflecting the magnitude of the current flowing through the second transmission transistor 12 and the second pull-down transistor 16, i.e., the read current is calculated.

As above, the operation of the components of the ring oscillator 2 in the oscillation state is explained.

Figure 5:
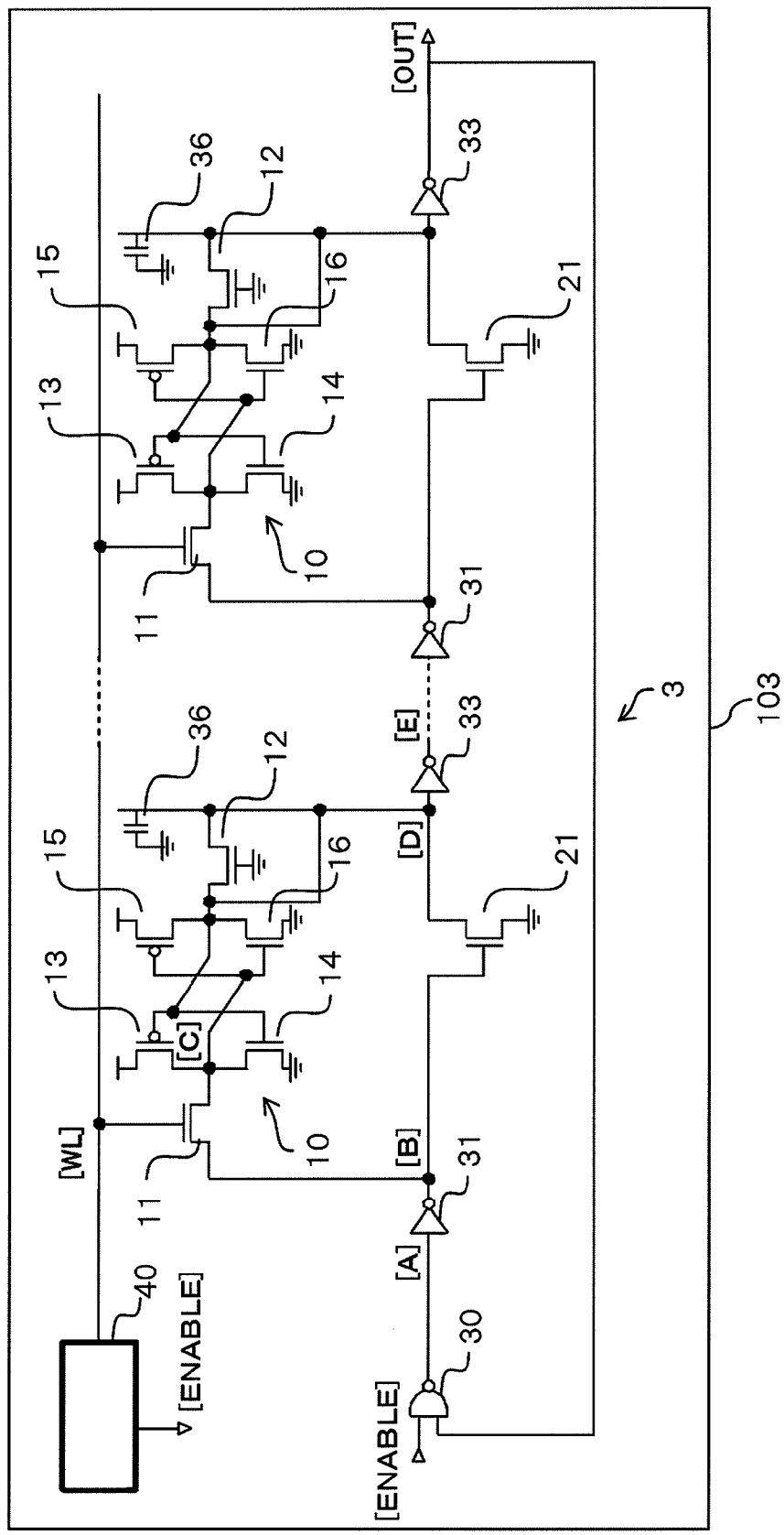
FIG. 5 is a diagram illustrating another example of a ring oscillator.
Figure 6:
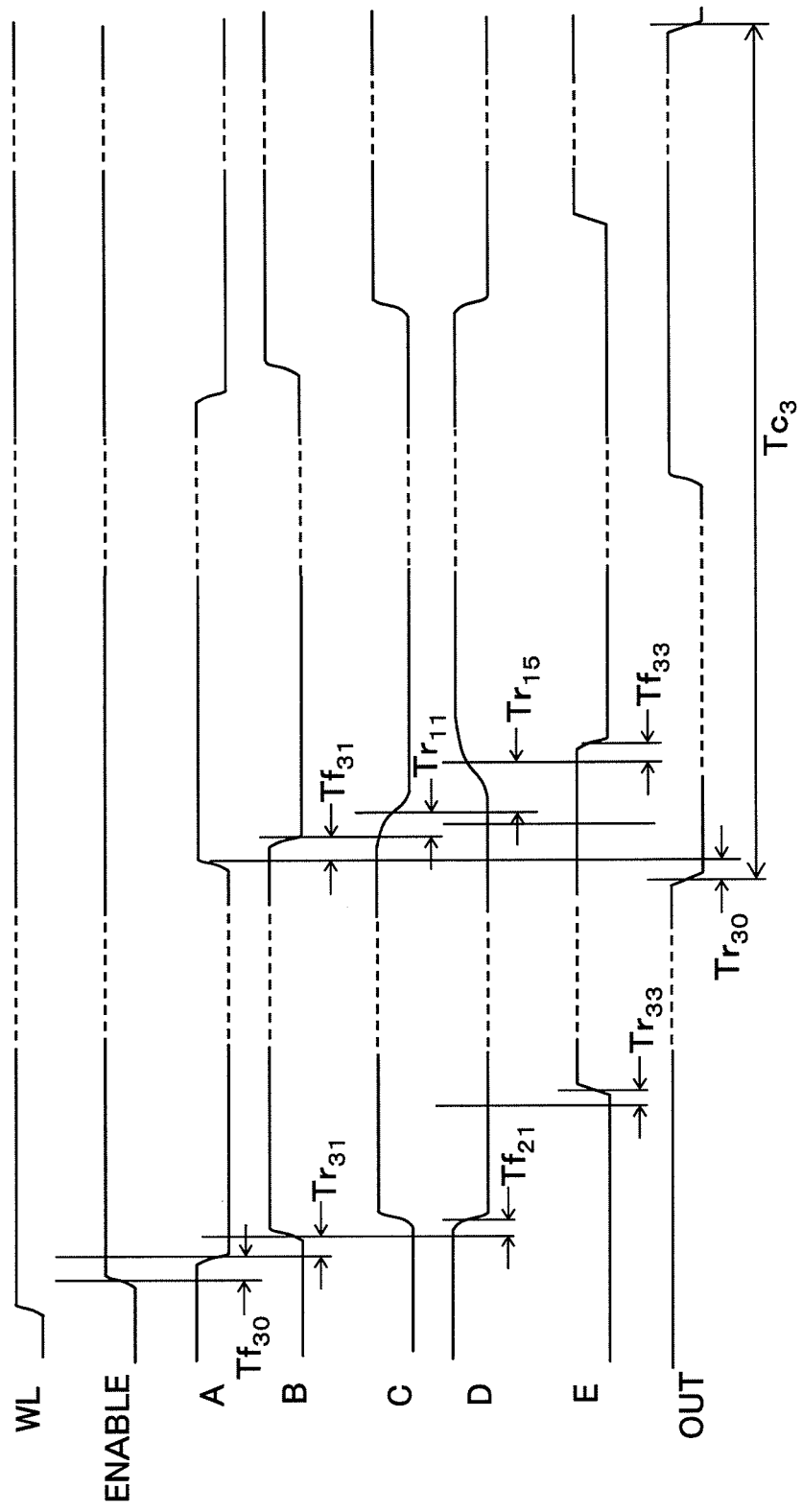
FIG. 6 is a timing chart of the ring oscillator described in FIG. 5.

Next, with reference to FIGS. 5 and 6, a third embodiment of a ring oscillator is explained.

FIG. 5 is a diagram illustrating an example of a ring oscillator.

A ring oscillator 3 has an even number of the SRAM cells 10 formed on a semiconductor device 103 and part of components of which are connected to the ring oscillator 3, an even number of pull-down elements 21, the NAND element 30, and an even number of the inverter elements 31 and 33. Further, the ring oscillator 3 has the control unit 40.

The gate terminal of the first transmission transistor 11 is connected to the word line. The drain terminal of the first transmission transistor 11 is connected to the output terminal of the inverter element 31.

The gate terminal of the second transmission transistor 12 is connected to VSS and the second transmission transistor 12 is always in the off state. The source terminal and the drain terminal of the second transmission transistor 12 are connected to the input terminal of the inverter element 33.

The output terminal of the inverter element 31 is connected to the drain terminal of the first transmission transistor 11 and to the gate terminal of the pull-down element 21.

The drain terminal of the pull-down element 21 is connected to the input terminal of the inverter element 33 and to the drain terminal of the second transmission transistor 12. Further, the drain terminal of the pull-down element 21 is connected to the gate terminals of the first pull-up transistor 13 and the first pull-down transistor 14, and to the drain terminals of the second pull-up transistor 15 and the second pull-down transistor 16.

Thus, the first transmission transistor 11, the first pull-up transistor 13 and the first pull-down transistor 14, and the second pull-up transistor 15 and the second pull-down transistor 16 are connected in parallel to the pull-down element 21.

The pull-down element 21 has a function to lower the signal level of a signal at the source terminal of the second transmission transistor 12 connected in parallel from the H level to the L level.

Next, the operation of the components of the ring oscillator 3 in the oscillation state is explained.

FIG. 6 is a timing chart of the ring oscillator 3.

As indicated by the waveform [WL], upon receipt of a command signal, the control unit 40 supplies the H-level signal to the word line. By supplying the H-level signal to the word line, the first transmission transistor 11 is active.

Next, as indicated by the waveform [ENABLE], the ring oscillator 3 enters the oscillation state by supplying the H-level signal to the first input terminal of the NAND element 30 from the control unit 40.

Next, as indicated by the waveform [A], when the time $Tf_{30}$ elapses after the H-level signal is input to the first input terminal, the NAND element 30 outputs the L-level signal to the input terminal of the inverter element 31. The time $Tf_{30}$ is the fall delay time of the NAND element 30.

Next, as indicated by the waveform [B], when the time $Tr_{31}$ elapses after the L-level signal is input to the input terminal, the inverter element 31 outputs the H-level signal to the gate terminal of the second pull-down transistor 16, to the gate terminal of the pull-up element 20, etc. The time $Tr_{31}$ is the rise delay time of the inverter element 31.

Next, as indicated by the waveform [C], when the time $Tf_{16}$ elapses after the H-level signal is input to the input terminal, the signal at the drain terminal of the second pull-down transistor 16 turns to a signal at the L level. The time $Tf_{16}$ is the delay time when the signal at the drain terminal of the second pull-down transistor 16 transits to fall. The signal at the drain terminal of the second pull-down transistor 16 is equivalent to the signal at the source terminal of the second transmission transistor 12.

Next, as indicated by the waveform [D], when the time $Tf_{12}$ elapses after the signal at the source terminal of the second transmission transistor 12 turns to the L level, the signal at the drain terminal of the second transmission transistor 12 turns to a signal at the L level. The time $Tf_{12}$ is the fall delay time of the second transmission transistor 12. The signal at the drain terminal of the second transmission transistor 12 is equivalent to the signal at the input terminal of the inverter element 33.

Next, as indicated by the waveform [E], when the time $Tr_{33}$ elapses after the L-level signal is input to the input terminal, the inverter element 33 outputs the H-level signal to the input terminal of the inverter element 31 in the second stage. The time $Tr_{33}$ is the rise delay time of the inverter element 33.

Then, the transition of the signal propagates sequentially up to the inverter element 33 in the final stage. Then, as indicated by the waveform [OUT], the inverter element 33 in the final stage outputs the L-level signal to the second input terminal of the NAND element 30.

Next, as indicated by the waveform [A], when the time $Tr_{30}$ elapses after the H-level signal is input to the second input terminal, the NAND element 30 outputs the H-level signal to the input terminal of the inverter element 31. The time $Tr_{30}$ is the rise delay time of the NAND element 30.

Next, as indicated by the waveform [B], when the time $Tf_{31}$ elapses after the H-level signal is input to the input terminal, the inverter element 31 outputs the L-level signal to the gate terminal of the second pull-down transistor 16, to the gate terminal of the pull-up element 20, etc. The time $Tf_{31}$ is the fall delay time of the inverter element 31.

Next, as indicated by the waveform [D], when the time $Tr_{20}$ elapses after the L-level signal is input to the gate terminal, the pull-up element 20 enters the on state and the source terminal of the pull-up element 20 turns to the H level. The time $Tr_{20}$ is the rise delay time of the pull-up element 20.

When the source terminal of the pull-up element 20 turns to the H level, the drain terminal of the second transmission transistor 12 and the input terminal of the inverter element 31 turn to the H level.

Next, as indicated by the waveform [E], when the time $Tr_{33}$ elapses after the L-level signal is input to the input terminal, the inverter element 33 outputs the H-level signal to the input terminal of the inverter element 31 in the second stage. The time $Tr_{33}$ is the rise delay time of the inverter element 33.

Then, the propagation reaches the inverter element 33 in the final stage and as indicated by the waveform [OUT], the inverter element 33 in the final stage outputs the H-level signal to the second input terminal of the NAND element 30. A time $Tc_3$ is the oscillation period of the ring oscillator 3.

A sum $Tr_{11+15}$ of the delay time $Tr_{11}$ and a delay time $Tr_{15}$ is calculated using a formula (3).

$$Tr_{11+15}=(Tc_3-(Ti+Tpu))/N \quad (3)$$

Here, $Tc_3$ is the oscillation period of the ring oscillator 3, $Ti$ is the total delay time of the NAND element 30 and the plurality of inverter elements 31 and 33, and $Tpu$ is the total delay time of the plurality of pull-up elements 20. N is the number of the first transmission transistors 11 and the first pull-down transistors 15 included in the ring oscillator 3.

By using the ring oscillator 3, the delay time $Tr_{11+15}$ reflecting the magnitude of the current flowing through the first transmission transistor 11 and the second pull-up transistor 15 is calculated.

As above, the operation of the components of the ring oscillator 3 in the oscillation state is explained.

Figure 7:
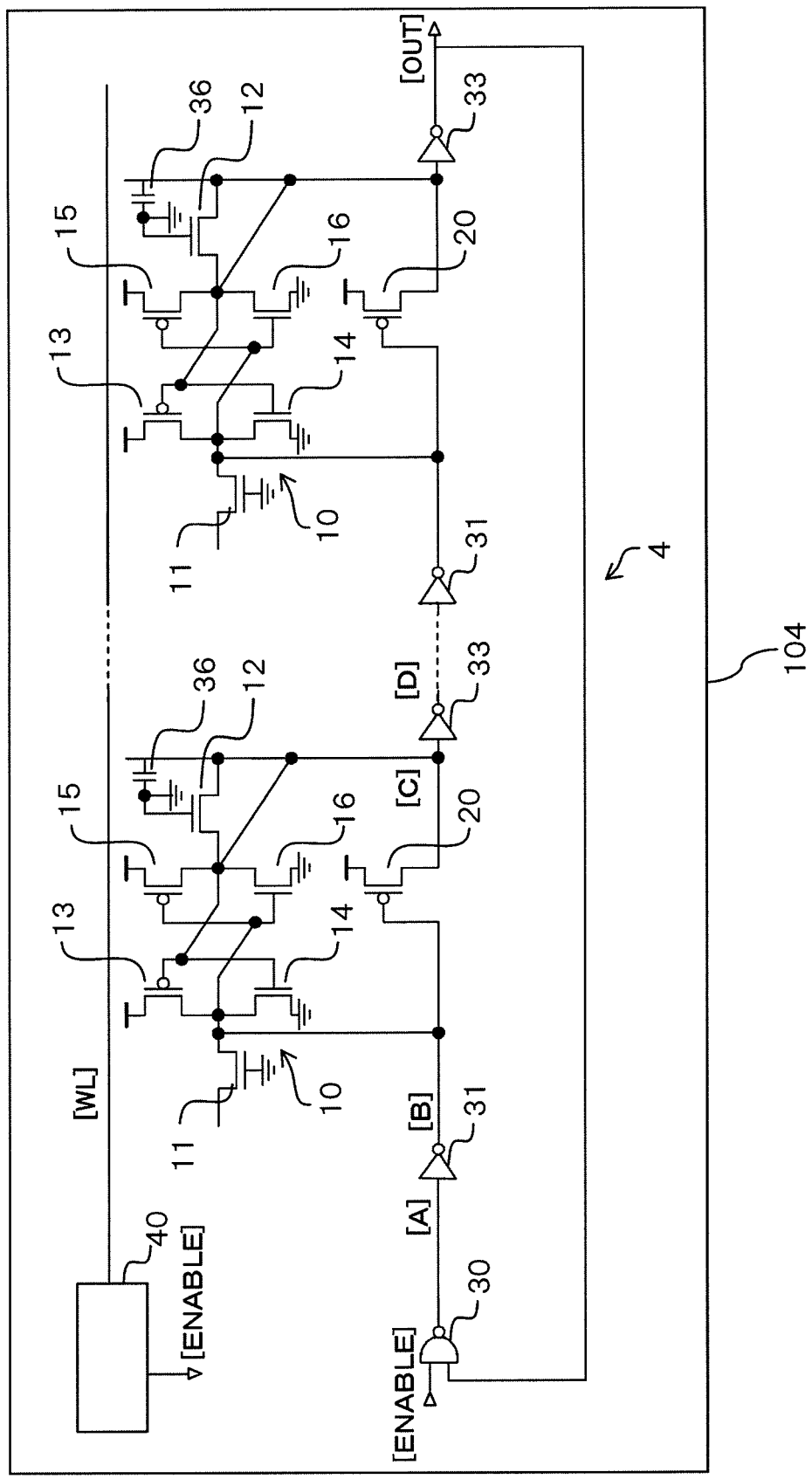
FIG. 7 is a diagram illustrating another example of a ring oscillator.
Figure 8:
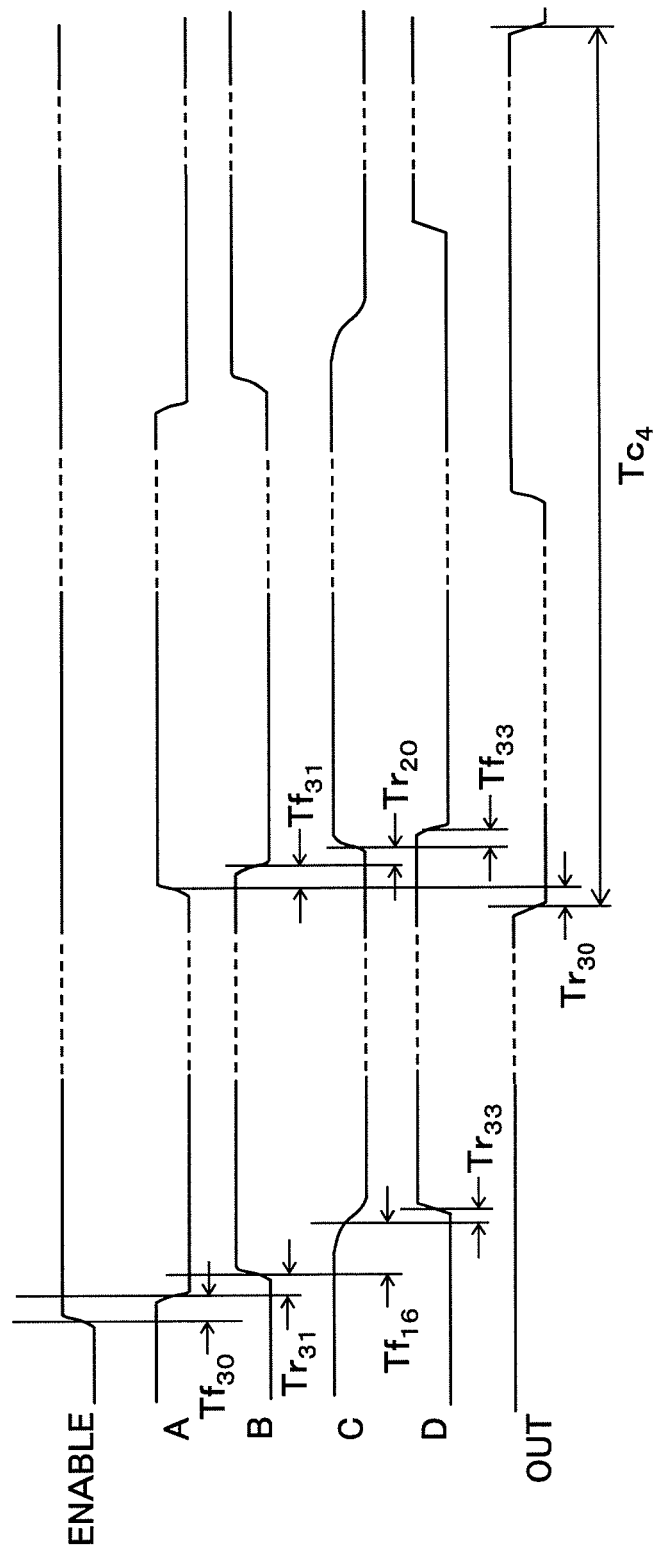
FIG. 8 is a timing chart of the ring oscillator described in FIG. 7.

Next, with reference to FIGS. 7 and 8, a fourth embodiment of a ring oscillator is explained.

FIG. 7 is a diagram illustrating an example of a ring oscillator.

A ring oscillator 4 is formed on a semiconductor device 104, and has an even number of the SRAM cells 10, an even number of the pull-up elements 20, the NAND element 30, and an even number of the inverter elements 31 and 33. Further, the ring oscillator 4 has the control unit 40.

The gate terminal of the first transmission transistor 11 is connected to VDD and the first transmission transistor 11 is always in the off state. The drain terminal of the first transmission transistor 11 is in the open state.

The gate terminal of the second transmission transistor 12 is connected to VSS and the second transmission transistor 12 is always in the off state. The source terminal and the drain terminal of the second transmission transistor 12 are connected to the input terminal of the inverter element 33.

The output terminal of the inverter element 31 is connected to the source terminal of the first transmission transistor 11 and to the gate terminal of the pull-up element 20. Further, the output terminal of the inverter element 31 is connected to the drain terminals of the first pull-up transistor 13 and the first pull-down transistor 14 and to the gate terminals of the second pull-up transistor 15 and the second pull-down transistor 16.

The drain terminal of the pull-up element 20 is connected to the input terminal of the inverter element 33 and to the drain terminal of the second transmission transistor 12. Further, the drain terminal of the pull-down element 21 is connected to the gate terminals of the first pull-up transistor 13 and the first pull-down transistor 14, and to the drain terminals of the second pull-up transistor 15 and the second pull-down transistor 16.

Thus, the first pull-up transistor 13 and the first pull-down transistor 14, and the second pull-up transistor 15 and the second pull-down transistor 16 are connected in parallel to the pull-up element 20.

The pull-up element 20 has a function to raise the signal level of a signal at the source terminal of the second pull-up transistor 15 connected in parallel from the H level to the L level.

Next, the operation of the components of the ring oscillator 4 in the oscillation state is explained.

FIG. 8 is a timing chart of the ring oscillator 4.

As indicated by the waveform [ENABLE], the ring oscillator 4 enters the oscillation state by supplying the H-level signal to the first input terminal of the NAND element 30 from the control unit 40.

Next, as indicated by the waveform [A], when the time $Tf_{30}$ elapses after the H-level signal is input to the first input terminal, the NAND element 30 outputs the L-level signal to the input terminal of the inverter element 31. The time $Tf_{30}$ is the fall delay time of the NAND element 30.

Next, as indicated by the waveform [B], when the time $Tr_{31}$ elapses after the L-level signal is input to the input terminal, the inverter element 31 outputs the H-level signal to the gate terminal of the second pull-down transistor 16, to the gate terminal of the pull-up element 20, etc. The time $Tr_{31}$ is the rise delay time of the inverter element 31.

Next, as indicated by the waveform [C], when the time $Tf_{16}$ elapses after the H-level signal is input to the input terminal, the signal at the drain terminal of the second pull-down transistor 16 turns to a signal at the L level. The time $Tf_{16}$ is the delay time when the signal at the drain terminal of the second pull-down transistor 16 transits to fall. The signal at the drain terminal of the second pull-down transistor 16 is equivalent to the signal at the input terminal of inverter element 33.

Next, as indicated by the waveform [D], when the time $Tr_{33}$ elapses after the L-level signal is input to the input terminal, the inverter element 33 outputs the H-level signal to the input terminal of the inverter element 31 in the second stage. The time $Tr_{33}$ is the rise delay time of the inverter element 33.

Then, the transition of the signal propagates sequentially up to the inverter element 33 in the final stage. Then, as indicated by the waveform [OUT], the inverter element 33 in the final stage outputs the L-level signal to the second input terminal of the NAND element 30.

Next, as indicated by the waveform [A], when the time $Tr_{30}$ elapses after the H-level signal is input to the second input terminal, the NAND element 30 outputs the H-level signal to the input terminal of the inverter element 31. The time $Tr_{30}$ is the rise delay time of the NAND element 30.

Next, as indicated by the waveform [B], when the time $Tf_{31}$ elapses after the H-level signal is input to the input terminal, the inverter element 31 outputs the L-level signal to the gate terminal of the second pull-down transistor 16, to the gate terminal of the pull-up element 20, etc. The time $Tf_{31}$ is the fall delay time of the inverter element 31.

Next, as indicated by the waveform [C], when the time $Tr_{20}$ elapses after the L-level signal is input to the gate terminal, the pull-up element 20 enters the on state and the source terminal of the pull-up element 20 turns to the H level. The time $Tr_{20}$ is the rise delay time of the pull-up element 20.

When the source terminal of the pull-up element 20 turns to the H level, the drain terminal of the second transmission transistor 12 and the input terminal of the inverter element 33 turn to the H level.

Next, as indicated by the waveform [D], when the time $Tr_{33}$ elapses after the L-level signal is input to the input terminal, the inverter element 33 outputs the H-level signal to the input terminal of the inverter element 31 in the second stage. The time $Tr_{33}$ is the rise delay time of the inverter element 33.

Then, the propagation reaches the inverter element 33 in the final stage and as indicated by the waveform [OUT], the inverter element 33 in the final stage outputs the H-level signal to the second input terminal of the NAND element 30. A time $Tc_4$ is the oscillation period of the ring oscillator 4.

The delay time $Tf_{16}$ is calculated using a formula (4).

$$Tf_{16}=(Tc_4-(Ti+Tpu))/N \qquad (4)$$

Here, $Tc_4$ is the oscillation period of the ring oscillator 4, Ti is the total delay time of the NAND element 30 and the plurality of inverter elements 31 and 33, and Tpu is the total delay time of the plurality of pull-up elements 20. N is the number of the second pull-down transistors 16 included in the ring oscillator 4.

By using the ring oscillator 4, the delay time $Tf_{16}$ reflecting the magnitude of the current flowing through the second pull-down transistor 16 is calculated.

As above, the operation of the components of the ring oscillator 4 in the oscillation state is explained.

Figure 9:
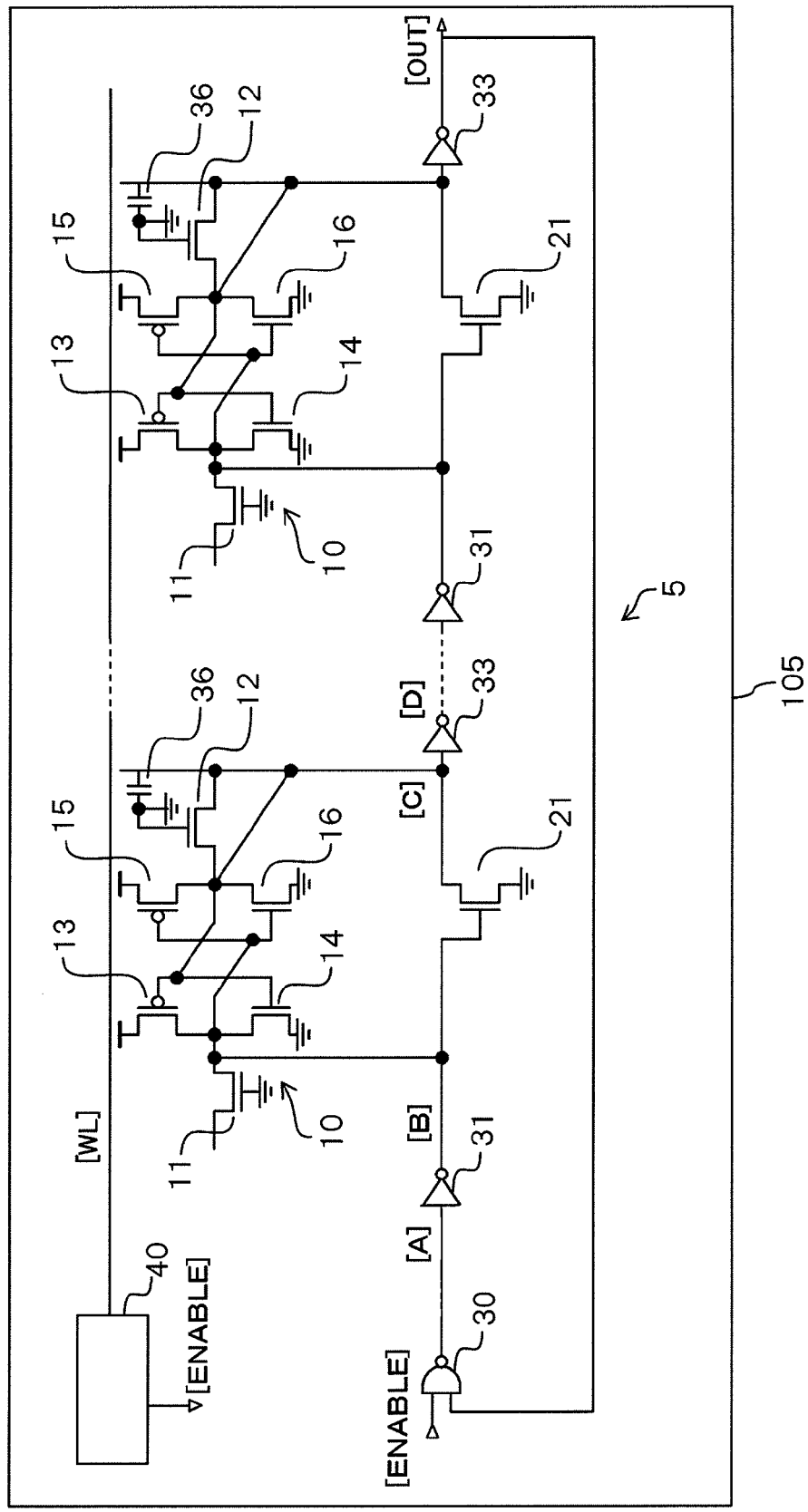
FIG. 9 is a diagram illustrating another example of a ring oscillator.
Figure 10:
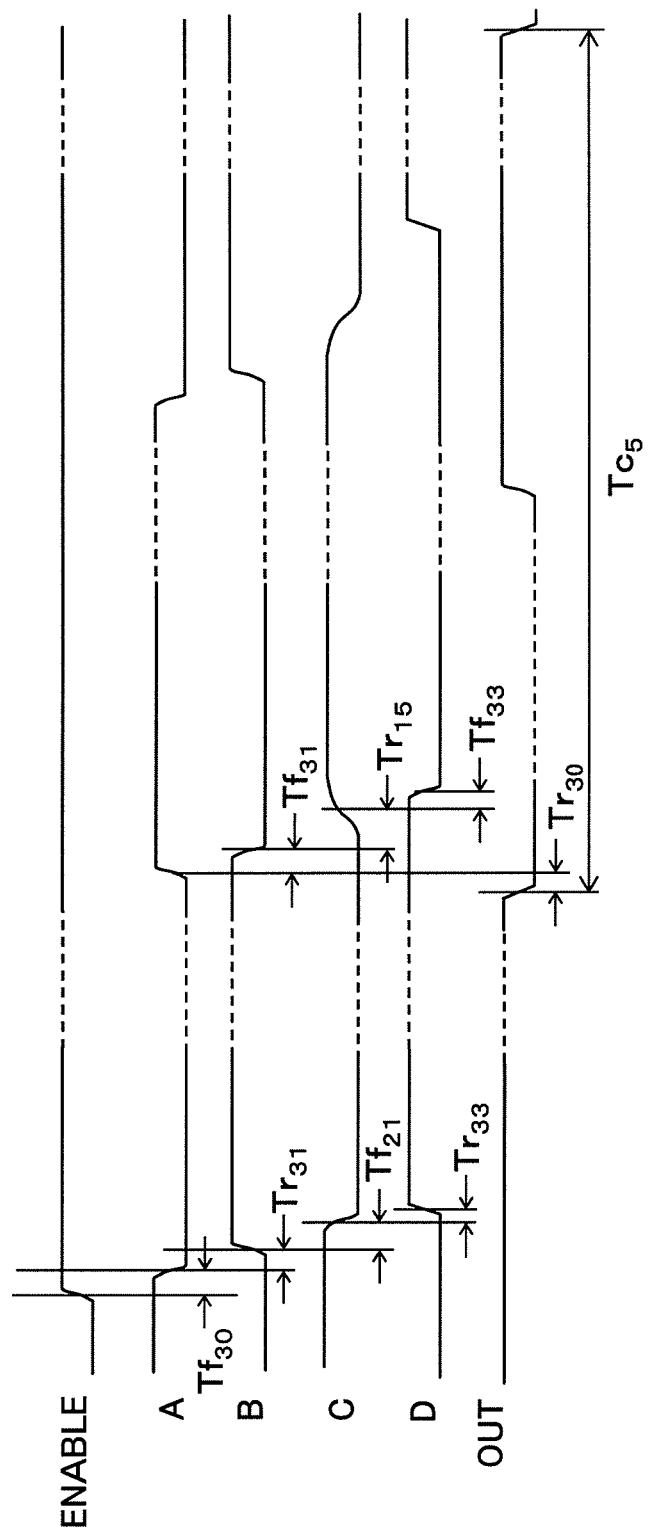
FIG. 10 is a timing chart of the ring oscillator described in FIG. 9.

Next, with reference to FIGS. 9 and 10, a fifth embodiment of a ring oscillator is explained.

FIG. 9 is a diagram illustrating an example of a ring oscillator.

A ring oscillator 5 differs from the ring oscillator 4 in that the pull-down element 21 is arranged in place of the pull-up element 20.

FIG. 10 is a timing chart of the ring oscillator 5.

From a period $Tc_5$ of the ring oscillator 5, the delay time $Tr_{15}$ when the output signal of the second pull-up transistor 15 transits to rise.

The delay time $Tr_{15}$ is calculated using a formula (5).

$$Tr_{15}=(Tc_5-(Ti+Tpu))/N \qquad (5)$$

Here, $Tc_5$ is the oscillation period of the ring oscillator 5, Ti is the total delay time of the NAND element 30 and the plurality of inverter elements 31 and 33, and Tpu is the total delay time of the plurality of pull-up elements 20. N is the number of the second pull-down transistors 16 included in the ring oscillator 5.

By using the ring oscillator 5, the delay time $Tr_{15}$ reflecting the magnitude of the current flowing through the second pull-up transistor 15 is calculated.

As above, the operation of the components of the ring oscillator 5 in the oscillation state is explained.

Figure 11:
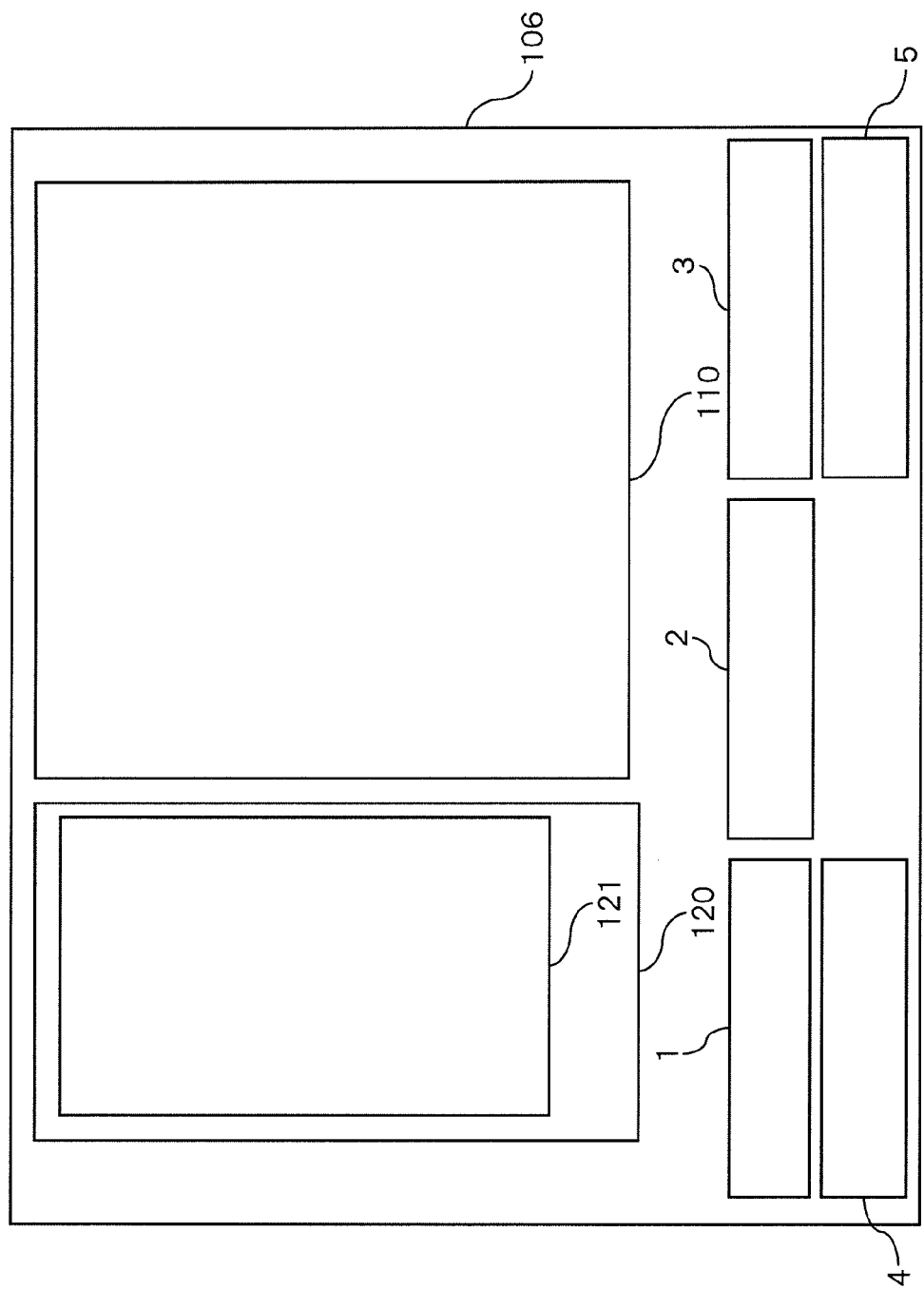
FIG. 11 is a diagram illustrating a semiconductor device on which a plurality of ring oscillators are mounted.

Next, with reference to FIG. 11, an embodiment of a semiconductor device on which a plurality of ring oscillators is mounted is explained.

FIG. 11 is a diagram illustrating a semiconductor device 106 on which the ring oscillators 1 to 5 are mounted.

The semiconductor device 106 has the five ring oscillators 1 to 5, a logic circuit part 110, and a memory circuit part 120.

The logic circuit part 110 has a plurality of logic circuits arranged based on the same layout wiring rules. The memory circuit part 120 has an SRAM cell array 121 in which the plurality of SRAM cells 10 is arranged in the form of an array based on the layout wiring rules whose interval is narrower than that of the layout wiring rules based on which the logic circuits are arranged. In the SRAM cell array 121, it is possible to adjust the body potential of the N well, the body potential of the P well, and the potential of the word line from the outside of the semiconductor device 106.

The SRAM cells 10 of the ring oscillators 1 to 5 are arranged based on the same layout wiring rules as those based on which the SRAM cells 10 are arranged in the SRAM cell array 121 of the memory circuit part 120. The pull-up elements 20, the pull-down elements 21, the NAND elements 30, and the inverter elements 31 to 33 of the ring oscillators 1 to 5 are arranged based on the same layout wiring rules as those based on which the logic circuits of the logic circuit part 110 are arranged.

The semiconductor device 106 further has an output part, not illustrated schematically, and can take out each oscillation signal output from the OUT terminals of the ring oscillators 1 to 5 as an output signal.

In the semiconductor device 106, it is possible to adjust the body potential of the N well, the body potential of the P well, and the potential of the word line based on the oscillation periods $Tc_1$ to $Tc_5$ of the ring oscillators 1 to 5. For example, if writing characteristics are poor, adjustment is performed so that the current of the transmission transistor is larger than the current of the pull-up transistor. If the read speed is low in addition to the poor writing characteristics, the body potentials of both the pull-up transistor and the pull-down transistor are forwarded. On the other hand, if the read speed is high, if the body potential of the nMOS transistor is forwarded, the so-called stability margin is degraded and the retaining characteristics deteriorate. Thus, if the read speed is high, the current of the transmission transistor is somewhat reduced conversely by adjusting the potential of the word line and at the same time, the current of the pull-up transistor is somewhat reduced by making the body potential of pMOS backward.

In each of the ring oscillators 1 to 5, a measurement target element, which is one of the components of the plurality of SRAM cells 10, and a compensation path circuit including the pull-up element 20 or the pull-down element 21 are connected in parallel. The pull-up element 20 is a signal drive element that pulls up the output terminal of the component at the time of rise of the signal at the output terminal of the component of the SRAM cell 10 connected in parallel. The pull-down element 21 is a signal drive element that pulls down the output terminal of the component at the time of fall of the signal at the output terminal of the component of the SRAM cell 10 connected in parallel.

Each of the ring oscillators 1 to 5 has the compensation path circuit including the signal drive element, and therefore can separately measure the delay time at the time of rise and the delay time at the time of fall of the measurement target element of the SRAM cell 10. Thus, it is possible to calculate the delay time reflecting the current ratio etc. of the transmission transistor and the pull-up transistor of the SRAM cell 10 from the measurement results of the oscillation periods of the ring oscillators 1 to 5. Then, it is possible to adjust the writing operation margin, the reading timing operation margin, and the stability operation margin suitable to the characteristics of the SRAM cell 10, based on these calculation results. Further, a timing defect is avoided by the adjustment, and therefore it is possible to set a faster timing.

Hereinafter, other embodiments are explained.

The configuration of the present invention is not limited to those of the ring oscillators 1 to 5. For example, a configuration may be used in which the pull-up elements 20 of the ring oscillators 1 and 2 are replaced with the pull-down elements 21, respectively. As an example, a configuration may be used in which the pull-down element 21 of the ring oscillator 3 is replaced with the pull-up element 20.

In the ring oscillators 1 to 5, the plurality of SRAM cells 10 is arranged. However, it is also possible to lay out only the single SRAM cell 10.

In the ring oscillators 1 to 5, the capacitor 36 is the parasitic capacitor of the bit line connected in parallel to another SRAM cell other than the SRAM cell 10. However, it is also possible to utilize the junction capacitance of the transistor. By increasing the capacitance of the capacitor 36 and increasing the transistor size of the pull-up element 20 or the pull-down element 21, which is the signal drive element, it is possible to increase the ratio of the delay time of the component of the SRAM cell 10 that accounts for in the oscillation period.

The semiconductor device 106 has the SRAM cell array 121 and the ring oscillators 1 to 5. However, it is also possible to mount each of the ring oscillators 1 to 5 in a wafer in which the semiconductor device is formed. Further, in the semiconductor device 106, the ring oscillators 1 to 5 each have the control part 40, it is also possible to control each of the ring oscillators 1 to 5 by a signal control unit.

In an embodiment, the ring oscillator has a path circuit configured to output an output signal to the delay circuit in the next stage in response to the other transition of one of the transitions. Thus, by using the ring oscillator, it is possible to separately measure the rise delay time and the fall delay time, respectively, of the component forming the SRAM cell.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A ring oscillator comprising:
a plurality of delay circuits, which are ring-connected, wherein
at least one of the plurality of delay circuits includes an SRAM cell having a first node to which an input signal inputs and a second node from which an output signal outputs, and a path circuit connected in parallel to the SRAM cell,
the SRAM cell outputs the output signal from the second node to a delay circuit in the next stage within the plurality of delay circuits in response to one transition of rise transition and fall transition of the input signal to be input to the first node from a delay circuit in the previous stage within the plurality of delay circuits,
the path circuit outputs an output signal to the delay circuit in the next stage in response to the other transition than the one transition of the rise transition and the fall transition,
the SRAM cell has a first and a second transmission transistor, a first transistor and a second transistor connected in series, whose gate terminals are connected to a source terminal of the first transmission transistor and whose drain terminals are connected to a source terminal of the second transmission transistor, and a third transistor and a fourth transistor connected in series, whose gate terminals are connected to the source terminal of the second transmission transistor and whose drain terminals are connected to the source terminal of the first transmission transistor, and
at least one of the first node and the second node is directly connected to the drain terminal of the first transistor and the drain terminal of the second transistor or the drain terminal of the third transistor and the drain terminal of the fourth transistor.

2. The ring oscillator according to claim 1, wherein an output terminal of the path circuit enters a high-impedance state at the time of the one of transitions.

3. The ring oscillator according to claim 1, wherein to the first node, the drain terminal of the first transmission transistor is connected and to the second node, the source terminal of the first transmission transistor is connected.

4. The ring oscillator according to claim 1, wherein to the first node, the source terminal of the first transmission transistor is connected and to the second node, the drain terminal of the second transmission transistor is connected.

5. The ring oscillator according to claim 1, wherein to the first node, the drain terminal of the first transmission transistor is connected and to the second node, the source terminal of the second transmission transistor is connected.

6. The ring oscillator according to claim 1, wherein the path circuit has one of a pull-up element configured to enter a high-impedance state at the time of the one of transition and to pull up the second node at the time of the other transition and a pull-down element configured to enter a high-impedance state at the time of the one of transition and to pull down the second node at the time of the other transition.

7. A semiconductor device comprising:
an SRAM cell array including a plurality of first SRAM cells; and
a ring oscillator including a plurality of delay circuits which are ring-connected wherein
at least one of the plurality of delay circuits includes a second SRAM cell having a first node to which an input signal inputs and a second node from which an output signal outputs, and a path circuit connected in parallel to the second SRAM cell,
the second SRAM cell outputs the output signal from the second node to a delay circuit in the next stage within the plurality of delay circuits in response to one transition of rise transition and fall transition of the input signal to be input to the first node from a delay circuit in the previous stage within the plurality of delay circuits, the path circuit outputs an output signal to the delay circuit in the next stage in response to the other transition than the one transition of the rise transition and the fall transition, the second SRAM cell has a first and a second transmission transistor, a first transistor and a second transistor connected in series, whose gate terminals are connected to a source terminal of the first transmission transistor and whose drain terminals are connected to a source terminal of the second transmission transistor, and a third transistor and a fourth transistor connected in series, whose gate terminals are connected to the source terminal of the second transmission transistor and whose drain terminals are connected to the source terminal of the first transmission transistor, and at least one of the first node and the second node is directly connected to the drain terminal of the first transistor and the drain terminal of the second transistor or the drain terminal of the third transistor and the drain terminal of the fourth transistor.

\* \* \* \* \*